(12) United States Patent
Oh

(10) Patent No.: US 7,476,901 B2
(45) Date of Patent: Jan. 13, 2009

(54) POLY-SILICON THIN FILM TRANSISTOR ARRAY SUBSTRATE AND METHOD FOR FABRICATING THE SAME

(75) Inventor: Kum Mi Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 195 days.

(21) Appl. No.: 11/645,770

(22) Filed: Dec. 27, 2006

(65) Prior Publication Data

US 2007/0262317 A1 Nov. 15, 2007

(30) Foreign Application Priority Data

May 12, 2006 (KR) ...................... 10-2006-0042754

(51) Int. Cl.
*H01L 29/04* (2006.01)
(52) U.S. Cl. .................. 257/72; 257/59; 257/E29.285; 438/486

(58) Field of Classification Search .................. 257/72, 257/E29.285
See application file for complete search history.

(56) References Cited

U.S. PATENT DOCUMENTS 6,097,038 A * 8/2000 Jinno .......................... 257/57

* cited by examiner

*Primary Examiner*—Tu-Tu V Ho
(74) *Attorney, Agent, or Firm*—Holland & Knight LLP

(57) ABSTRACT

A poly-silicon thin film transistor array substrate includes a gate line and a gate electrode over a substrate, a semiconductor layer having source/drain regions doped with impurity ions, a data line crossing the gate line, and source/drain electrodes connected to the source/drain regions, and a pixel electrode connected to the drain electrode, wherein the semiconductor layer is poly-silicon except for a amorphous silicon region below the gate line.

28 Claims, 12 Drawing Sheets

POLY-SILICON THIN FILM TRANSISTOR ARRAY SUBSTRATE AND METHOD FOR FABRICATING THE SAME

This application claims the benefit of Korean Patent Application No. 10-2006-0042754, filed on May 12, 2006, which is hereby incorporated by reference in its entirety.

BACKGROUND OF THE INVENTION

1. Field of the Invention

The invention relates to a liquid crystal display (LCD) device, and more particularly, to a poly-silicon thin film transistor (TFT) array substrate and a method for fabricating the same.

2. Discussion of the Related Art

Active matrix liquid crystal display (AM-LCDs) devices are flat panel display devices widely utilized in a variety of applications, such as notebook computers, private mobile communication terminals, television (TV) sets and aircraft monitors. AM-LCDs have characteristics of low-driving voltage, full color rendering, compact size, thin profile, and lightweight due in part to the use of thin film transistors (TFTs) as switching devices. Thin film transistors (TFTs) can be broadly divided into TFTs using amorphous semiconductor films, such as amorphous silicon (a-Si), and TFTs using polycrystalline semiconductor films as an active semiconductor layer. Examples of polycrystalline silicon are poly-silicon (Poly-Si) and microcrystalline silicon (μ c-Si).

Semiconductors made of polycrystalline silicon have a carrier mobility that is 10 to 100 times greater than that of semiconductors made of amorphous silicon, so as to have excellent characteristics as an active layer for a switching device. Because the thin film transistors (TFTs) utilizing polycrystalline silicon in an active semiconductor layer can achieve high-speed operation, various logic circuits, such as CMOS-TFT (Complementary Metal Oxide Semiconductor TFT), EPROM (Erasable and Programmable Read Only Memory), EEPROM (Electrically Erasable and Programmable Read Only Memory) RAM (Random Access Memory), driving circuits of liquid crystal display (LCD) devices and driving circuits of electroluminescent display (ELD) devices use polycrystalline silicon TFTs as switching devices. The LCD device generally includes a TFT array substrate having a thin film transistor (TFT) for selective application of signals to a pixel electrode and a storage to ensure that the pixel region is maintained in the charged state until the unit pixel region is addressed by a next signal, a color filter layer array substrate having a color filter layer for realization of desired colors, a layer of liquid crystal molecules interposed between the TFT array substrate and the color filter layer array substrate, and a driving circuit for driving various elements on the two array substrates to display an image in response to external signals.

FIG. 1 is a process flow chart showing the fabrication sequence of a poly-silicon TFT array substrate according to the related art. FIGS. 2A to 2E are cross-sectional views of the process for forming a poly-silicon TFT array substrate according to the related art. FIG. 3A is a plan view of the related art poly-silicon TFT array substrate.

As shown in FIG. 2A, a buffer layer 12 of silicon dioxide ($SiO_2$) is formed over a surface of an insulating substrate 11 using a plasma enhanced chemical vapor deposition (PECVD) method. The PECVD method is based on the principle in which plasma-excited electrons collide with gaseous compounds introduced in a neutral state to decompose the gaseous compounds. The decomposed gaseous compounds are recombined to form a thin film by assistance of the reaction between the thus-formed gas ions and the thermal energy supplied from the gas. Thereafter, a poly-silicon layer 22 is formed over the surface of the buffer layer 12 using the PECVD method or the like, as described in step S11 of FIG. 1.

Next, as shown in FIG. 2B, the poly-silicon layer 22 is patterned to form a semiconductor layer 13 by photolithography, and an inorganic material $SiO_2$ is then deposited on the surface of the semiconductor layer 13 to form a gate insulating layer 14. Next, a low-resistance metal layer is deposited on the gate insulating layer 14 and is then patterned to form a gate line having a gate electrode 15a in one direction, as described in step S12 of FIG. 1. The gate electrode 15a is formed of one of a single metal layer of aluminum (Al) or copper (Cu), and a double metal layer having a metal stack of molybdenum (Mo), tungsten (W), chromium (Cr) or platinum (Pt) on an aluminum (Al) layer. The gate electrode 15a overlaps a predetermined region of the semiconductor layer 13.

Next, as shown in FIG. 2C, a high concentration of n-type impurity ions is doped into the semiconductor layer 13 using the gate electrode 15a as a mask to form source/drain regions 13a and 13b, as described in step S14 of FIG. 1. The semiconductor layer 13 between the source region 13a and the drain region 13b in which the impurity ions are not doped due to the shielding by the gate electrode 15a becomes a channel layer 13b.

Then, as shown in FIG. 2D, an inorganic material such as $SiO_2$ is deposited over the surface of the semiconductor layer 13, including the gate electrode 15a, by chemical vapor deposition (CVD), thereby forming an interlayer dielectric layer 16, as described in step S14 of FIG. 1.

Next, the surface of the semiconductor layer 13 is subjected to rapid thermal annealing (RTA), laser beam irradiation using excimer laser, or thermal annealing inside a furnace, thereby activating the semiconductor layer 13, as described in step S115 of FIG. 1. After the activation process, the gate insulating layer 14 and the interlayer dielectric layer 16 are etched to expose the source/drain regions 13a and 13b, thereby forming first contact holes 20a and 20b. To etch the gate insulating layer 14 and the interlayer dielectric layer 16, dry etching is commonly carried out.

Next, as shown in FIG. 2E, a low-resistance metal layer is deposited on the interlayer dielectric layer 16 and is then patterned to form a data line perpendicular to the gate line and having source/drain electrodes 17a and 17b, which are in contact with the source/drain regions 13a and 13b, respectively, as described in step S16 of FIG. 1. The source/drain electrodes 17a and 17b are formed of one of a single metal layer of aluminum (Al) or copper (Cu), and a double metal layer having a metal stack of molybdenum (Mo), tungsten (W), chromium (Cr) or platinum (Pt) on an aluminum (Al) layer. As a result of the above-described process steps, a poly-silicon thin film transistor is formed having an active semiconductor layer 13 utilizing poly-silicon.

Next, an inorganic material, such as silicon nitride (SiNx), is deposited over the poly-silicon thin film transistor, including the source/drain electrodes 17a and 17b, thereby forming a passivation layer 18, and then the substrate is heated to a range of heat resistance temperature thereof to perform a hydrogenation process, which diffuses hydrogen atoms contained in the passivation layer 18 into the polycrystalline semiconductor layer 13, as described in step S17 of FIG. 1.

Subsequently, the passivation layer 18 is selectively removed so as to expose the drain electrode 17b, thereby forming a second contact hole 40, and a pixel electrode 37 on a pixel region in such a manner that the pixel electrode 37 is in contact with the drain electrode 17b via the second contact hole 40 (S18).

The related art poly-silicon TFT array substrate and a method for fabricating the same employ an exposure mask at least 6 times for formation of a semiconductor layer, a gate line layer, first contact holes, a data line layer, a second contact hole, and a pixel electrode. Using exposure masks six times results in complicated processes that increase process time and process costs while lowering process efficiency. Further, exposure equipment is expensive. Therefore a great deal of study has been continuously made to omit process steps that involving use of the exposure equipment.

A method has been proposed which involves co-patterning of the semiconductor layer and the gate line layer by application of a diffraction exposure. When the semiconductor layer and the gate line layer are concurrently patterned by the diffraction exposure, as shown in FIG. 3, below the gate line 15 and the gate electrode 15a, the semiconductor layer 13 is disposed in the same pattern as the gate line and the gate electrode, and extends over the right/left sides of the gate electrode 15a. The semiconductor layers on the right/left sides of the gate electrode become the source and drain regions, respectively. In such a pattern, a data voltage applied to a first sub-pixel through the data line 17 should flow to be charged to a pixel electrode 19 of the first sub-pixel through a thin film transistor of the first sub-pixel (Route ①), but the data voltage flows to be charged through the semiconductor layer disposed below the gate line to a pixel electrode of a second sub-pixel adjacent to the first sub-pixel (Route ②), thereby resulting in a problem of signal distortion.

SUMMARY OF THE INVENTION

Accordingly, embodiments of the invention are directed to a poly-silicon thin film transistor array substrate and a method for fabricating the same that substantially obviate one or more problems due to limitations and disadvantages of the related art.

An object of embodiments of the invention is to provide a poly-silicon thin film transistor (TFT) array substrate and a method for fabricating the same that prevents signal distortion between adjacent sub-pixels.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these objects and other advantages and in accordance with the purpose of the invention, as embodied and broadly described herein, a poly-silicon thin film transistor array substrate includes a gate line and a gate electrode over a substrate, a semiconductor layer having source/drain regions doped with impurity ions, a data line crossing the gate line, and source/drain electrodes connected to the source/drain regions, and a pixel electrode connected to the drain electrode, wherein the semiconductor layer is poly-silicon except for a amorphous silicon region below the gate line.

In another aspect of embodiments of the invention, a method for fabricating a poly-silicon thin film transistor array substrate includes forming an amorphous silicon layer on a substrate, selectively crystallizing the amorphous silicon layer, forming a gate insulating layer and a metal layer on the selectively-crystallized silicon layer, patterning the selectively-crystallized silicon layer, the gate insulating layer and the metal layer so as to form a semiconductor layer, a gate line and a gate electrode, implanting impurities into source/drain regions of the semiconductor layer using the gate electrode as a mask, forming source/drain electrodes insulated from the gate electrode and connected to the source/drain regions, and a data line crossing the gate line, and forming a pixel electrode connected to the drain electrode.

A method for fabricating a poly-silicon thin film transistor array substrate includes forming a semiconductor layer divided into an amorphous silicon portion and a poly-silicon portion on a substrate, forming a gate line and a gate electrode insulated from the semiconductor layer, wherein the amorphous silicon portion is overlapped by the gate line, implanting impurities into source/drain regions of the semiconductor layer using the gate electrode as a mask, forming source/drain electrodes connected to the source/drain regions and a data line crossing the gate line, and forming a pixel electrode connected to the drain electrode.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Figure 1:
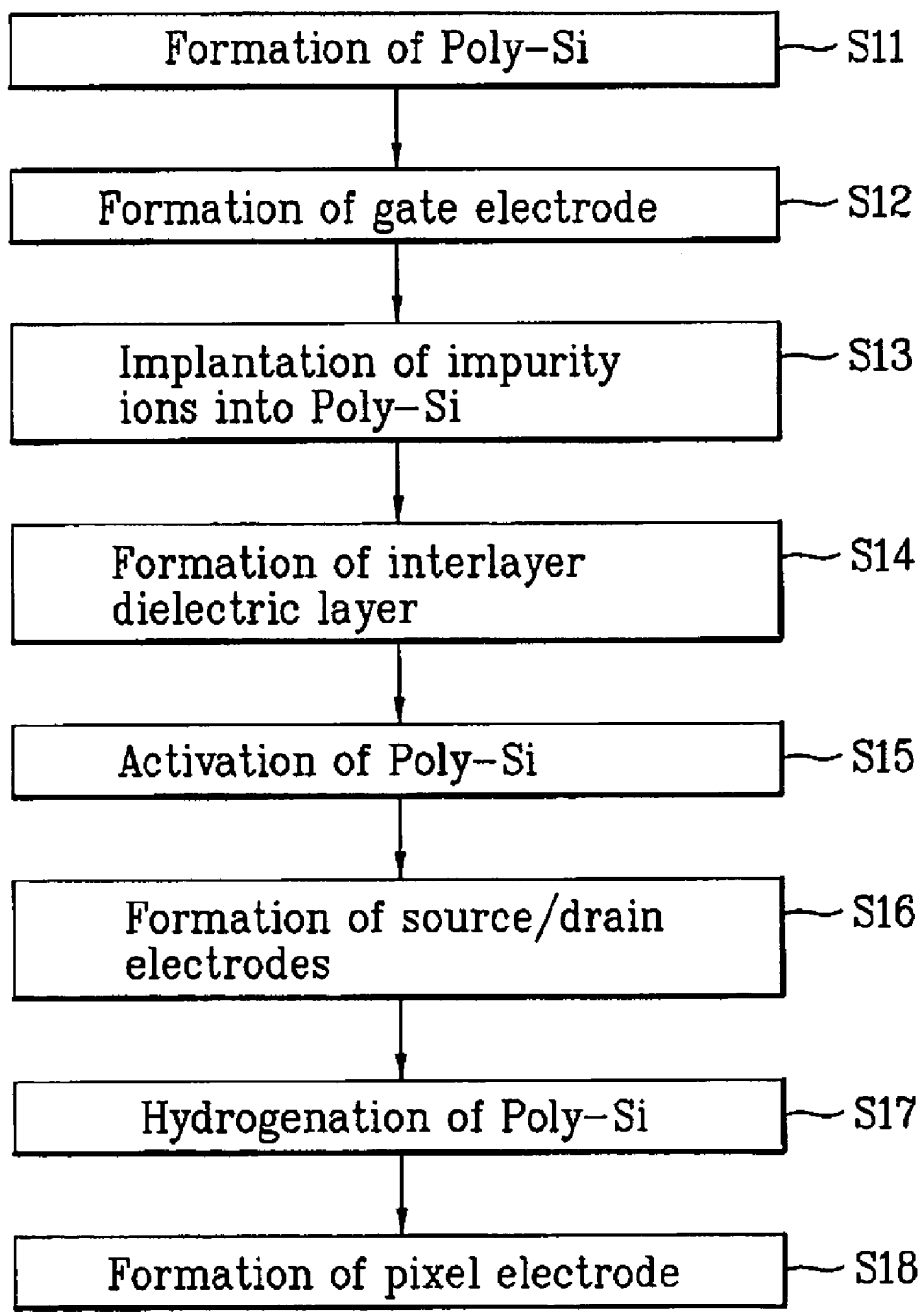
FIG. 1 is a process flow chart showing a fabrication sequence of a poly-silicon TFT array substrate according to the related art.
Figure 2A:
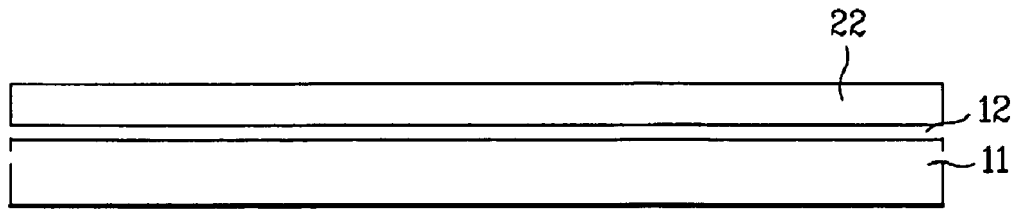
FIGS. 2A to 2E are cross-sectional views of the process for forming a poly-silicon TFT array substrate according to the related art.
Figure 2B:
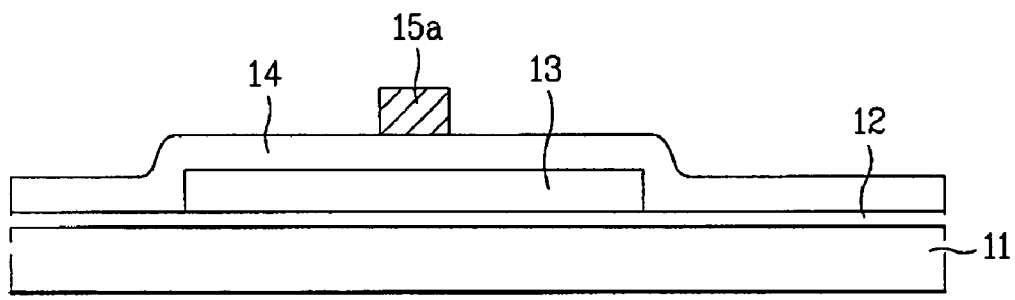
Figure 2C:
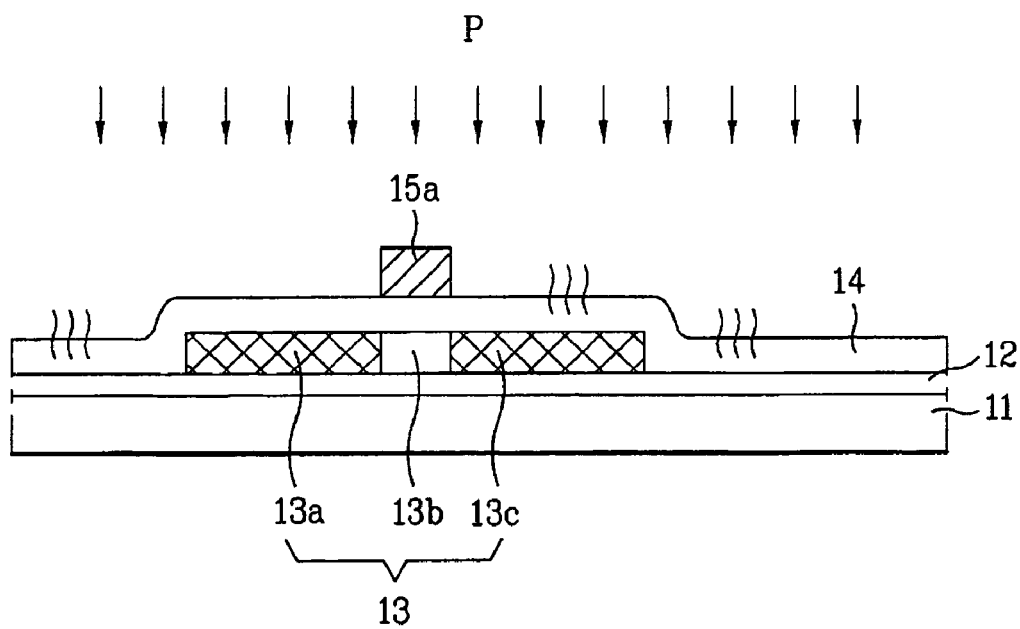
Figure 2D:
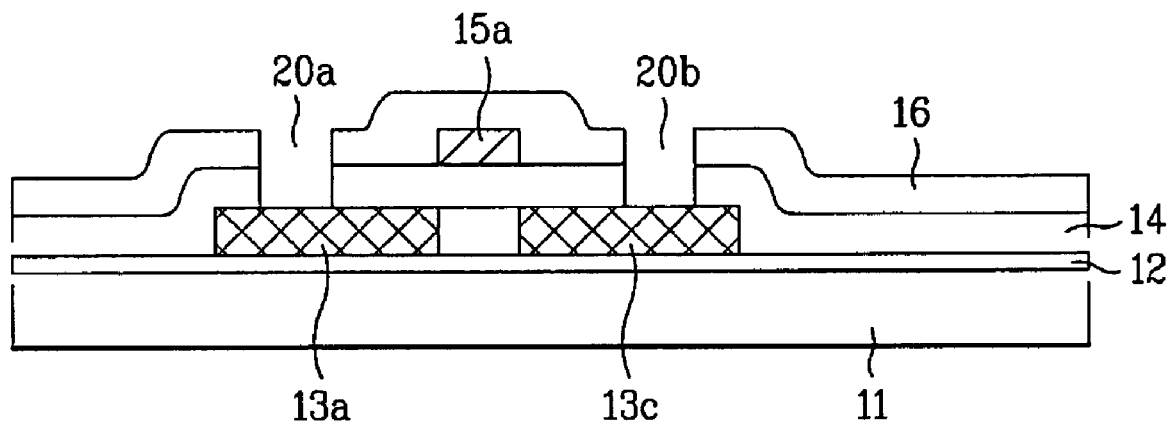
Figure 2E:
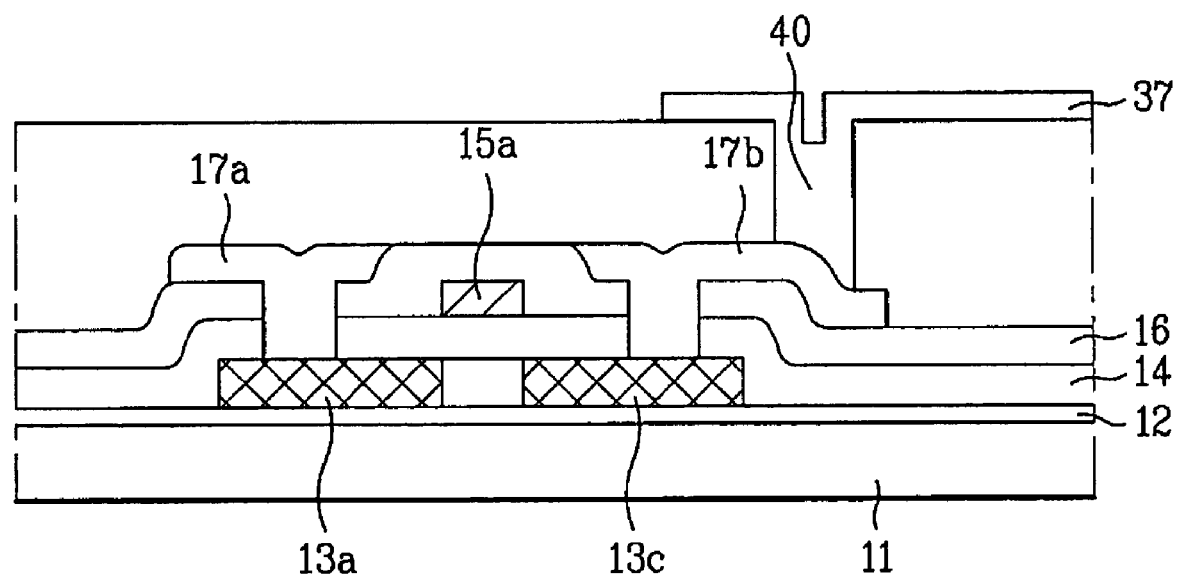
Figure 3:
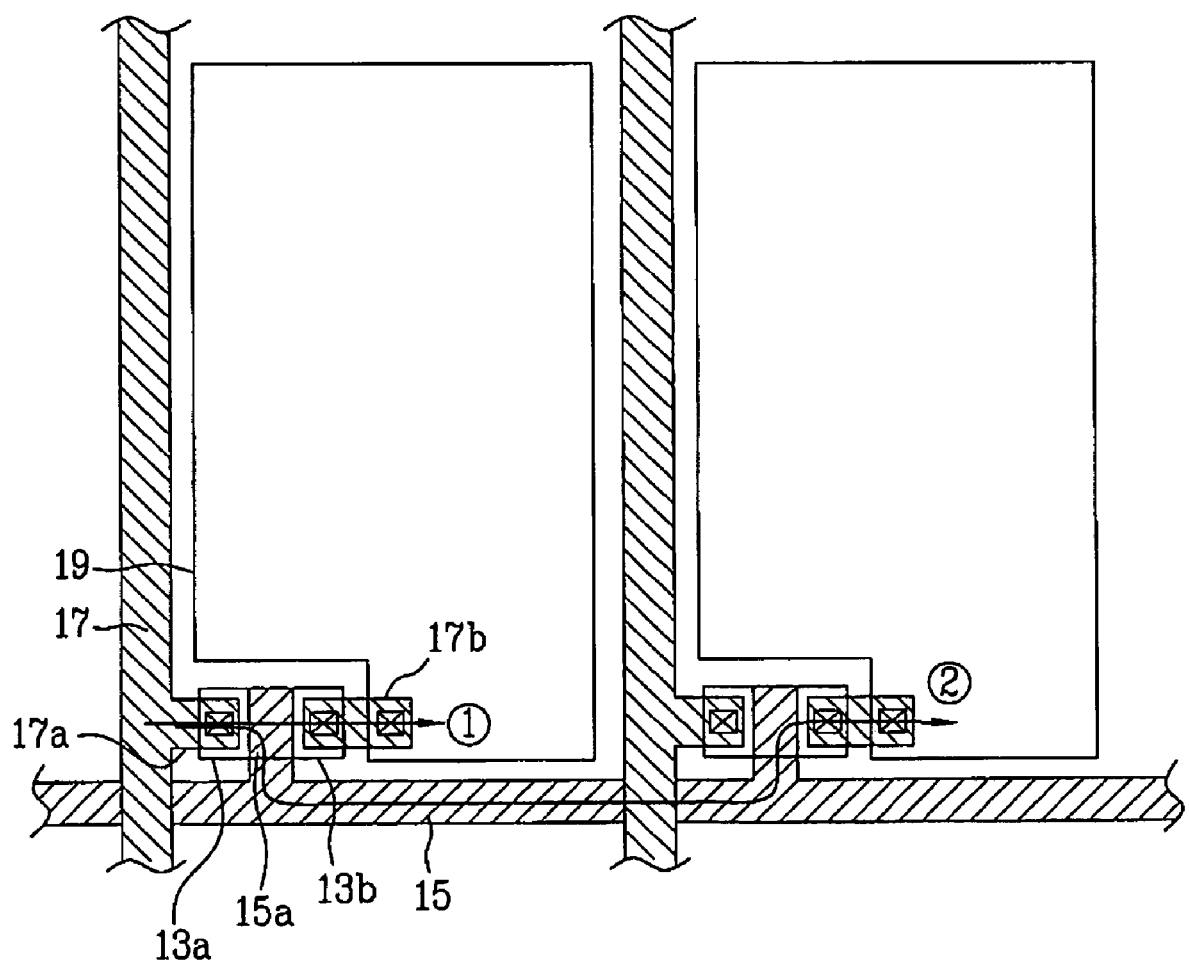
FIG. 3 is a plan view of the related art poly-silicon TFT array substrate.

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 4:
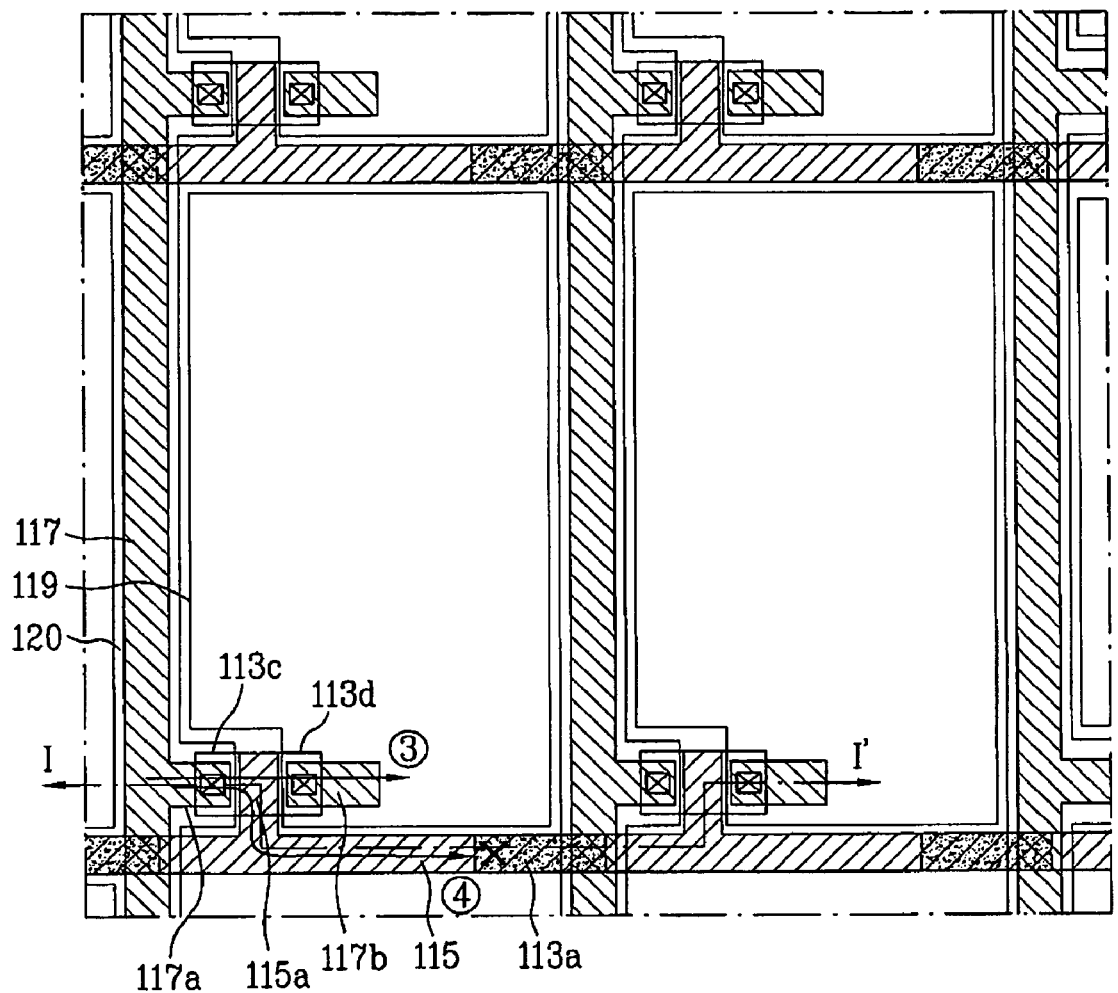
FIG. 4 is a plan view of a poly-silicon TFT array substrate according to an embodiment of the invention.
Figure 5:
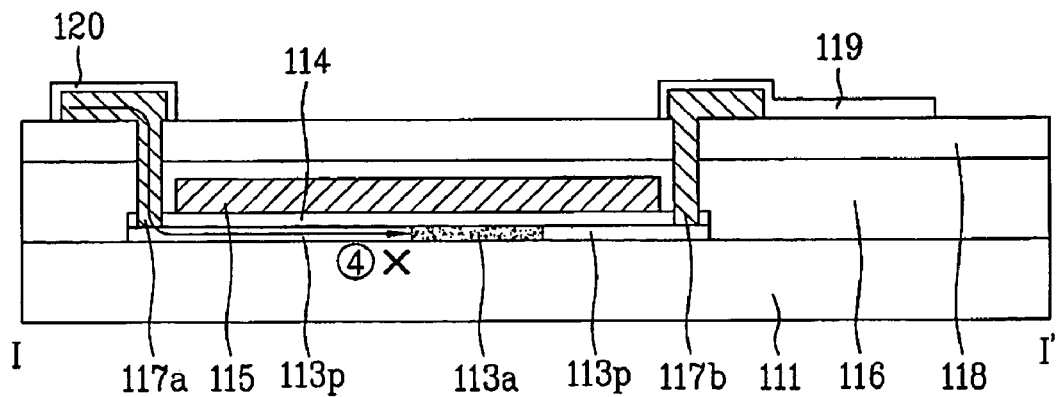
FIG. 5 is a cross-sectional view taken along I-I' line of FIG. 4.

FIG. 4 is a plan view of a poly-silicon TFT array substrate according to an embodiment of the invention, and FIG. 5 is a cross-sectional view taken along line I-I' of FIG. 4. The poly-silicon TFT array substrate according to an embodiment of the invention, as shown in FIGS. 4 and 5, includes a gate line 115 and a gate electrode 115a that are integrally formed on a substrate 111, a semiconductor layer 113 formed in the same pattern as the gate line that is partially crystallized into a poly-silicon 113p except for a predetermined region below the gate line, source/drain regions 113c and 113d that are parts of the semiconductor layer 113 formed on the right/left sides of the gate electrode 115a by implantation of impurity ions, a data line 117 perpendicular to the gate line 115 to define a sub-pixel and source/drain electrodes 117c and 117d in contact with the source/drain regions 113c and 113d at the upper part of the gate electrode 115a, and a pixel electrode 119 in contact with the drain electrode 117d. An embodiment of the invention selectively crystallizes a predetermined region of an amorphous silicon semiconductor layer such that portion below the gate line still remains as amorphous silicon 113a without undergoing crystallization while other regions, including the channel layer, is crystallized into the poly-silicon 113p. In other words, the amorphous silicon region remains while the poly-silicon regions are created.

The semiconductor layer 113 and the gate line layer 115 are electrically insulated from each other by a gate insulating layer 114, and the gate insulating layer has the same pattern as the semiconductor layer and/or the gate line layer. In addition, a stacked layer of an interlayer dielectric layer 116 and a passivation layer 118 is further provided over the surface of the semiconductor layer 113 between the gate electrode 115 and the source/drain electrodes 117a and 117b. The source/drain electrodes 117a and 117b are in contact with the source/drain regions 113c and 113d through the stacked layer of the gate insulating layer 114, an interlayer dielectric layer 116 and a passivation layer 118.

The data line 117 and the source/drain electrodes 117a and 117b are formed exposed on the passivation layer 118. Therefore, the drain electrode 117b is covered by the pixel electrode 119, and the integrally formed data line 117 and source electrode 117a are covered by an oxidation-preventing layer 120, which is further formed on the same layer on which the pixel electrode is formed. Alternatively, the interlayer dielectric layer 116 can be provided over the surface of the semiconductor layer 113 between the gate electrode 115a and source/drain electrodes 117a and 117b, and the passivation layer 118 can be provided between the source/drain electrodes and a pixel electrode 119, provided that the pixel electrode is in contact with the drain electrode through the passivation layer.

Thin film transistors (TFTs) for controlling turn-on and turn-off of a voltage are provided in individual sub-pixels defined by a gate line 115 and a data line 117. The TFT includes a semiconductor layer 113 having the source/drain regions 113c and 113d doped with impurity ions and the undoped channel layer, a gate insulating layer 114 formed over the semiconductor layer 113, a gate electrode 115a overlapping an upper part of the channel layer on the gate insulating layer 114, a stacked layer of the interlayer dielectric layer 116 and the passivation layer 118 formed over the gate electrode 115a, and the source/drain electrodes 117a and 117b in contact with the source/drain regions through the passivation layer. If the TFT is a p-type, the source/drain regions are doped with p-type impurity ions, such as boron (B) or the like. On the other hand, if the TFT is an n-type, the source/drain regions are doped with n-type impurity ions, such as phosphorus (P), arsenic (As) or the like.

By crystallization of the semiconductor layer 113, including the channel layer into poly-silicon 113p, and leaving the predetermined regions at the lower part of the gate line 115 as amorphous silicon 113, as shown in FIG. 5, a data voltage applied via the source electrode 117a of the first sub-pixel flows to be charged into a pixel electrode of the first sub-pixel (Route ③) while the amorphous silicon 113a (Route ④) blocks an undesirable data voltage from flowing into the second sub-pixel. Thus, it is possible to prevent or at least weaken the flow of the data voltage of the first sub-pixel through the poly-silicon 113p into the second sub-pixel. This is because there is a significant difference between the poly-silicon mobility of the channel layer and the amorphous silicon mobility below the gate line between the adjacent sub-pixels.

Figure 6A:
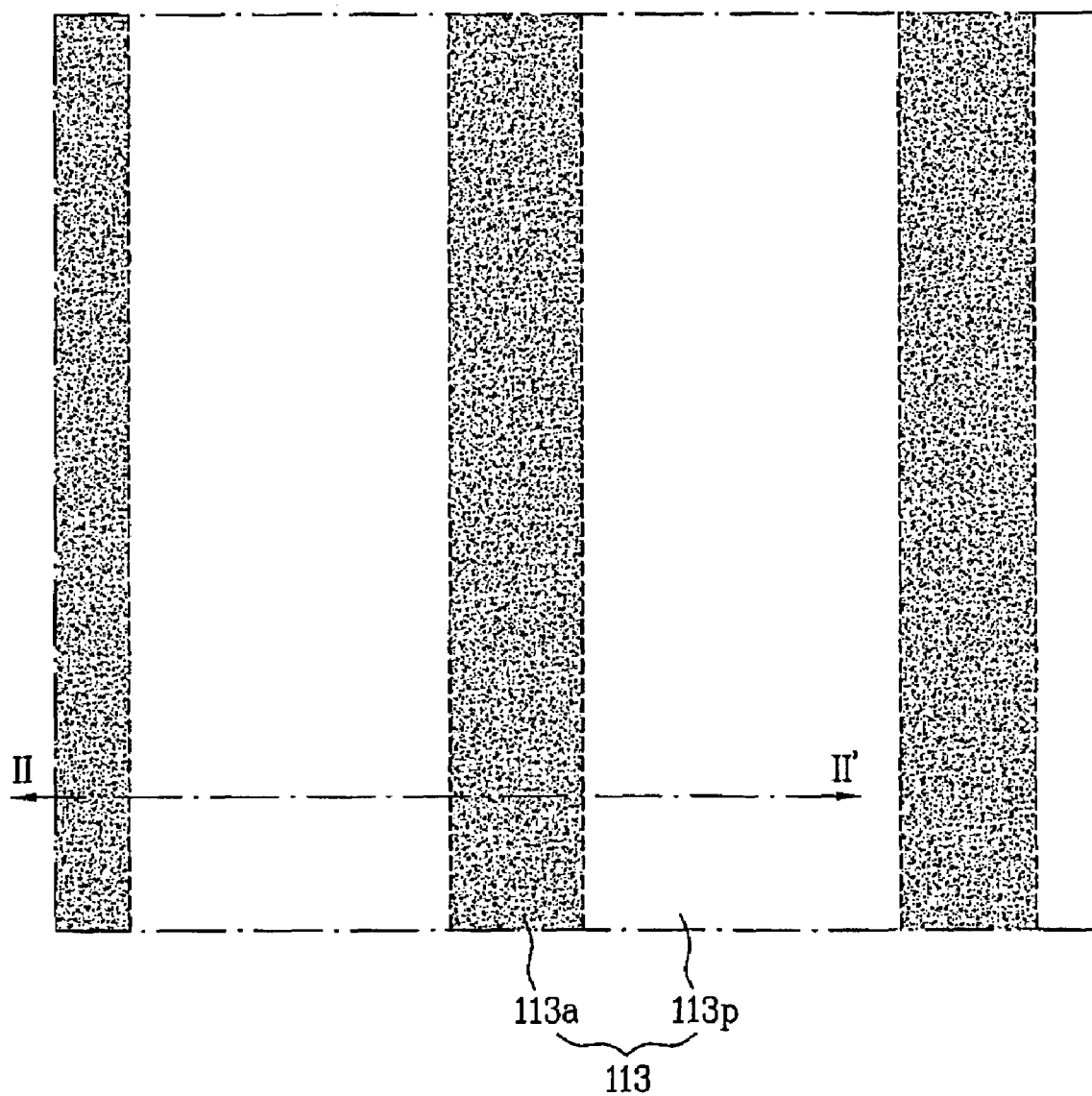
FIGS. 6A to 6D are plan views of a process for fabricating a poly-silicon TFT array substrate according to an embodiment of the invention.
Figure 6B:
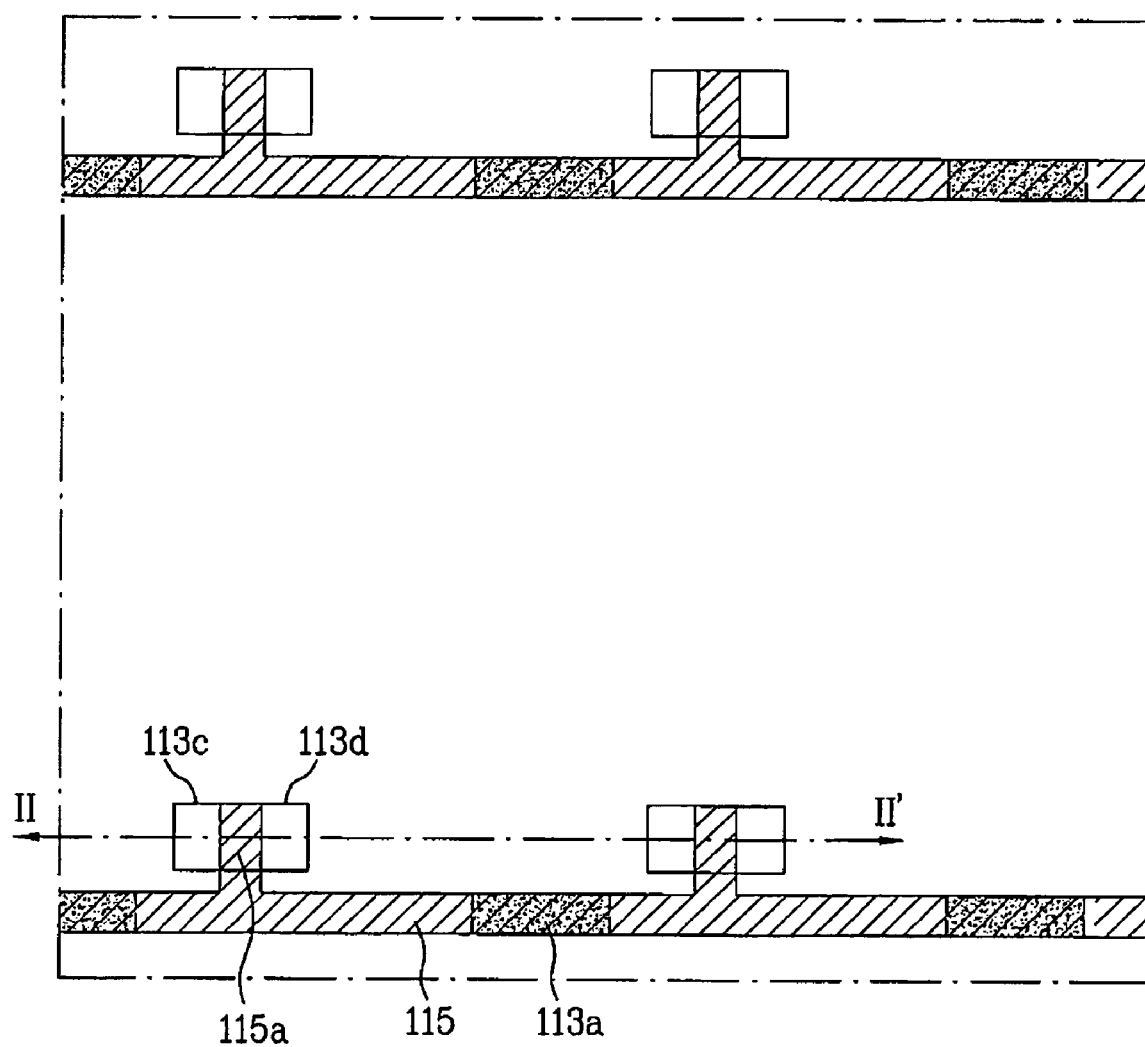
Figure 6C:
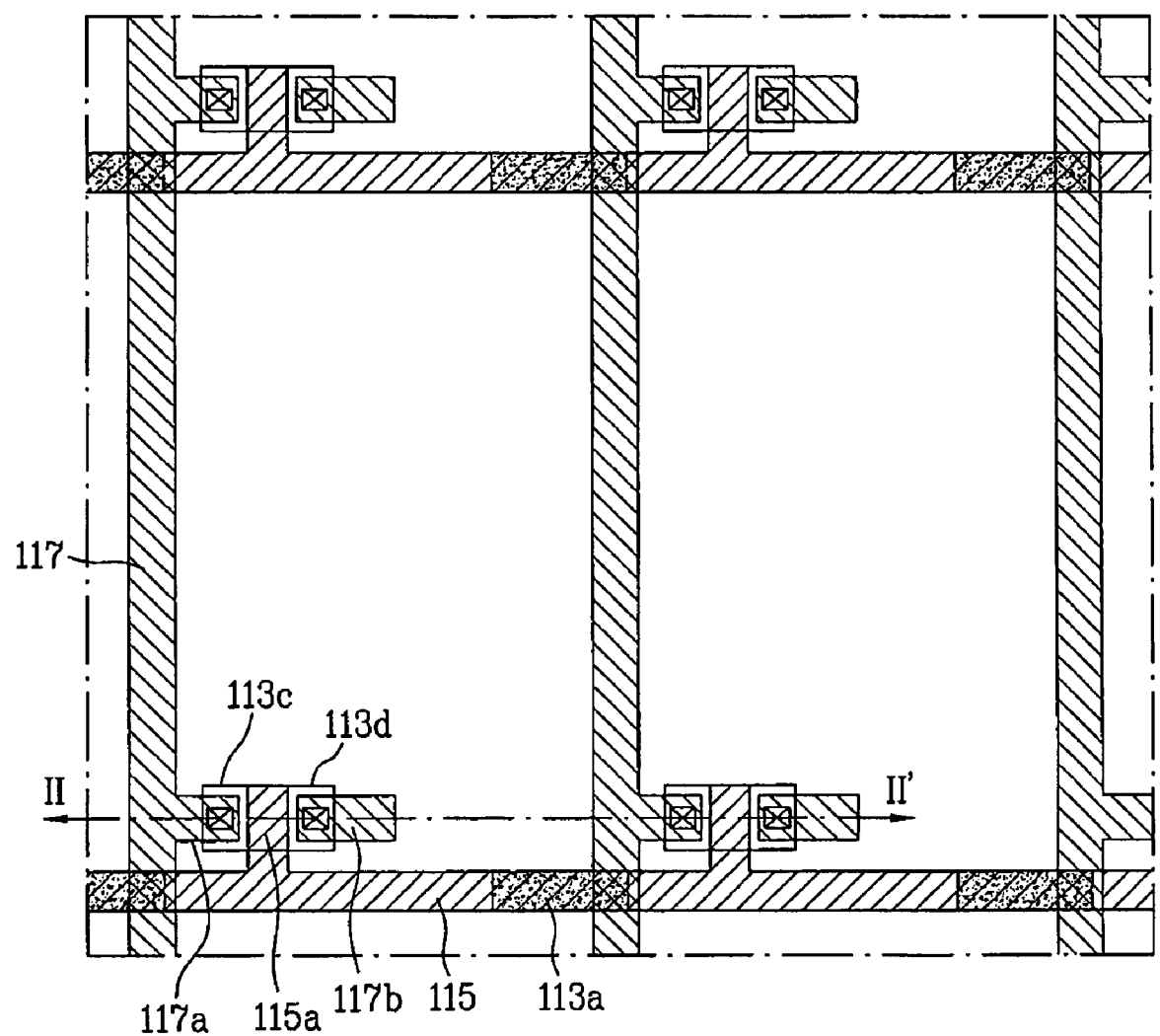
Figure 6D:
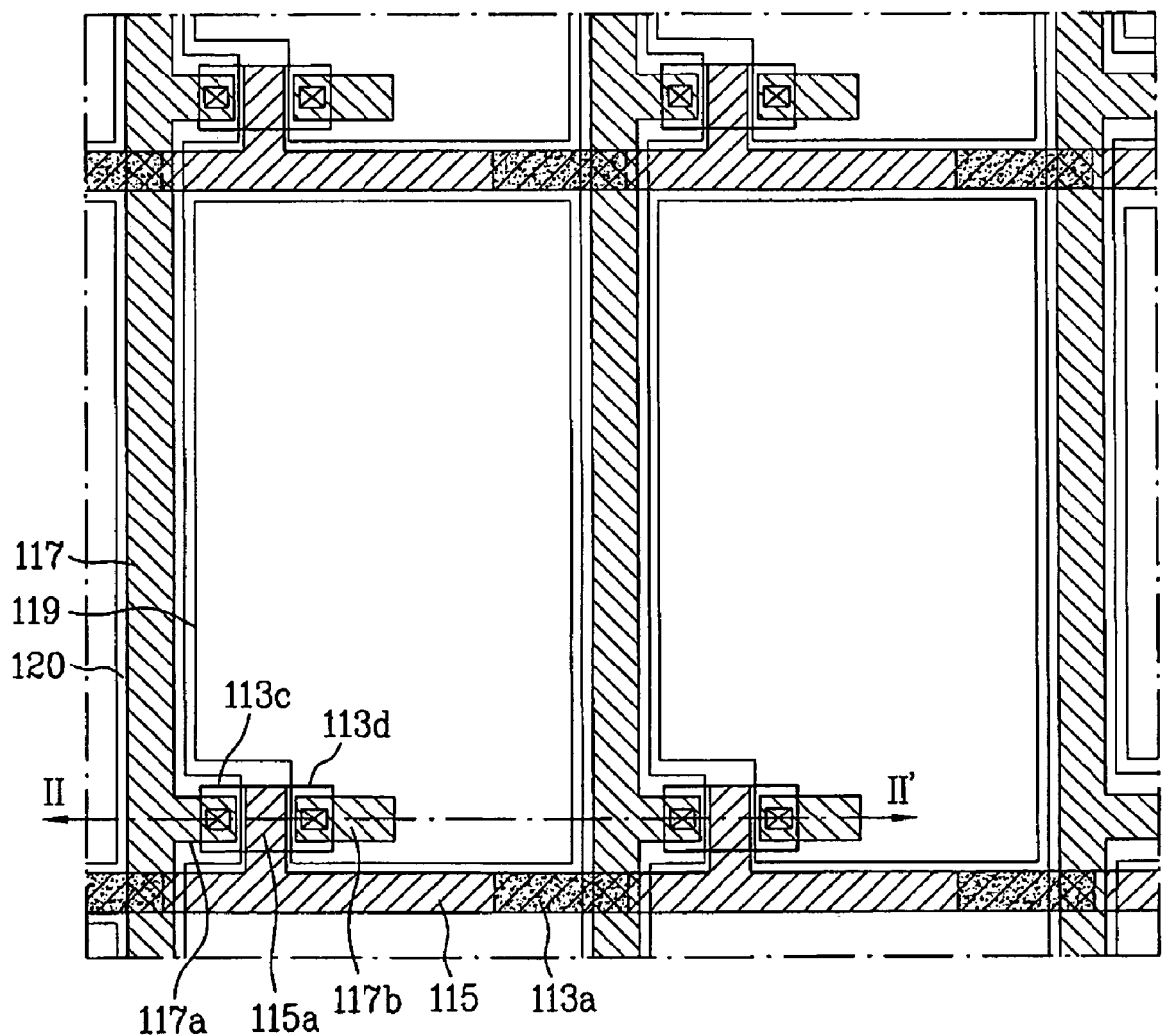
Figure 7A:
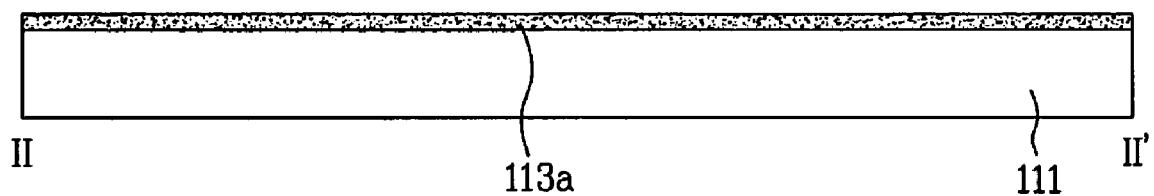
FIGS. 7A to 7G are process cross-sectional views taken along line II-II' of FIGS. 6A to 6D.

FIGS. 6A to 6D are plan views of the process for fabricating a poly-silicon TFT array substrate according to an embodiment of the invention, and FIGS. 7A to 7G are process cross-sectional views taken along line II-II' of FIGS. 6A to 6D. As shown in FIG. 7A, the amorphous silicon 113a is deposited over the surface of the insulating substrate 111 using chemical vapor deposition (CVD) or the like. Although not shown in FIG. 7A, a buffer layer of silicon dioxide ($SiO_2$) may be further formed between the insulating substrate 111 and the amorphous silicon 113a. The buffer layer prevents penetration of foreign materials into the semiconductor layer which may take place in subsequent processes, protects the insulating substrate against high temperatures in a crystallization process of the amorphous silicon layer, and improves contact characteristics of the semiconductor layer with the insulating substrate. Due to the risk of poor interface binding between the $SiO_2$ buffer layer and the amorphous silicon layer resulting from the presence of large numbers of dangling bonds on the surface of the amorphous silicon layer, a dehydrogenation process may be carried out to remove hydrogen atoms from the amorphous silicon layer, prior to crystallization of the amorphous silicon.

Figure 7B:
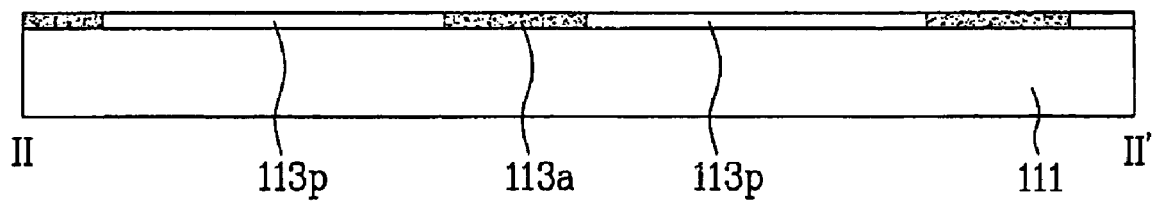

Next, as shown in FIG. 6A and FIG. 7B, the amorphous silicon layer 113a is subjected to selective crystallization. Examples of methods for deposition and crystallization of the amorphous silicon layer 113a can include solid phase crystallization (SPC) involving a long-term heat treatment at a high temperature and then crystallization, excimer laser annealing (ELA) involving application of excimer laser to perform crystallization while heating to about 250° C., and sequential lateral solidification (SLS) which is capable of remarkably improving crystallization characteristics by lateral growth of crystal grains. The solid phase crystallization (SPC) is a heat treatment method for formation of a poly-silicon thin film at a temperature of around 600° C., and involves forming an amorphous silicon thin film on a glass substrate and then subjecting the thus-formed film to heat treatment at about 600° C. for several hours to several tens of hours, thereby crystallizing the amorphous silicon thin film.

In contrast to the heat treatment method, the excimer laser annealing (ELA) is a method for fabrication of a poly-silicon thin film at a low temperature, and achieves crystallization of an amorphous silicon thin film by instantaneous irradiation of a high-energy laser beam having a pulse period of several tens of nanoseconds to the amorphous silicon thin film. This method has an advantage in that melting and crystallization of amorphous silicon are achieved within a very short period of time such that there is no damage to the glass substrate. Further, the poly-silicon thin films fabricated using excimer laser have superior electrical properties, as compared to the poly-silicon thin films fabricated using typical heat treatment methods.

In recent years, the sequential lateral solidification (SLS) is primarily employed, and is a method involving the growth of crystal grains at the interface between liquid-phase silicon and solid-phase silicon, wherein the crystal grains grow in the direction perpendicular to the interface. This method is a crystallization method which is capable of increasing a size of silicon crystal grains via lateral growth of the crystal grains to a given length by appropriately controlling a magnitude of laser energy and an irradiation range of laser beam. Upon performing selective crystallization, the growth direction of the crystal grains may be controlled depending upon the selection of desired crystallization processes. It is possible to induce smooth passage of the electric field of the channel layer by ensuring the growth of the crystal grains in the direction of the gate line (horizontal direction) via application of the SLS method. That is, since the crystal grains are formed to have a long length in the horizontal direction, thereby further improving the mobility of the channel layer, it is possible to further prevent defects associated with the flow of signals into adjacent sub-pixels.

Figure 7C:
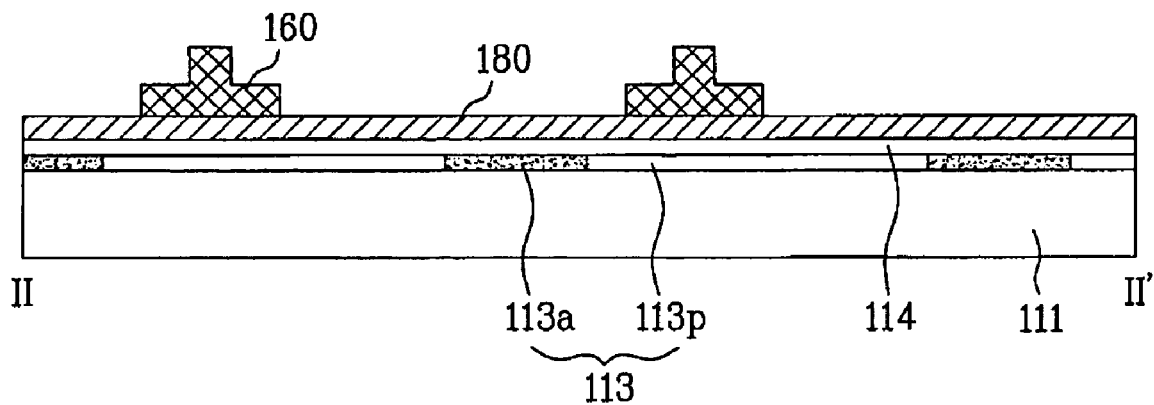

As shown in FIG. 7C, an inorganic material, such as silicon oxide (SiOx) or a silicon nitride (SiNx), is deposited over the upper part of the semiconductor layer 113, composed of the amorphous silicon 113a and poly-silicon 113p due to selective crystallization, thereby forming a gate insulating layer 114. To prevent signal delay, a metal having a low resistivity, such as copper (Cu), aluminum (Al), aluminum alloy, e.g. aluminum-neodymium (AlNd), molybdenum (Mo), chromium (Cr), titanium (Ti), tantalum (Ta) or molybdenum-tungsten (MoW) is deposited over the gate insulating layer 114 to form a metal layer 180. Then, a photoresist 160 of a ultraviolet curable resin is applied over the metal layer 180, using a spin coating or roll coating method. Then, an exposure mask having a given mask formed thereon (not shown) is coated on the upper part of the photoresist 160, and the photoresist 160 is then exposed to UV light or X-ray wavelengths.

The exposed photoresist is developed to form a photoresist pattern having the double step difference. Herein, the exposure mask is a diffraction exposure mask, and is divided into three regions, such as a transparent region, a semi-transparent region and a light-shielding region by forming a light-shielding layer made of a metal and a semi-transparent layer on a transparent substrate. The transparent region has a light transmittance of 100%, the light-shielding region has a light transmittance of 0%, and the semi-transparent region has a light transmittance of 0 to 100%. Therefore, the photoresist 160 subjected to the diffraction exposure is divided into three parts, such as a part undergoing complete removal, a part undergoing no removal and a part having a medium thickness, so as to form a double step difference structure.

Figure 7D:
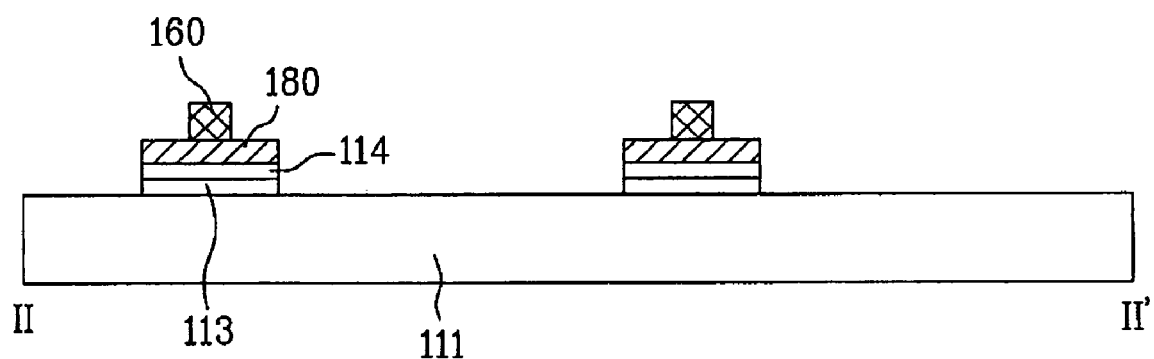

Next, as shown in FIGS. 6B and 7D, the semiconductor layer 113, the gate insulating layer 114 and the metal layer 180 are collectively etched using the photoresist 160 as a mask to form a gate line 115 and a gate electrode 115a. The layers of materials can be collectively etched in one dry etching chamber, and different etchant gases are used due to the different kinds of the materials to be etched. First, when a metal layer (Mo) is etched, $SF_6$, $Cl_2$ and $O_2$ gases are used. For etching of amorphous silicon, SF6, C12 and H2 gases are used. For etching of the gate insulating layer 114, $SF_6$, $O_2$ and He gases are used. The semiconductor layer and the gate insulating layer are disposed in the same pattern as the gate line and the gate electrode therebelow.

Next, photoresist ashing is carried out until the photoresist 160 having a medium thickness is completely removed. The metal layer 180 exposed between the thus-ashed photoresist is etched to define the source/drain regions 113c and 113d of the semiconductor layer 113. To ensure that the semiconductor layer 113 and the gate insulating layer 114 are not etched, wet etching can be carried out using HF, BOE, NH4F or a mixed solution thereof.

Figure 7E:
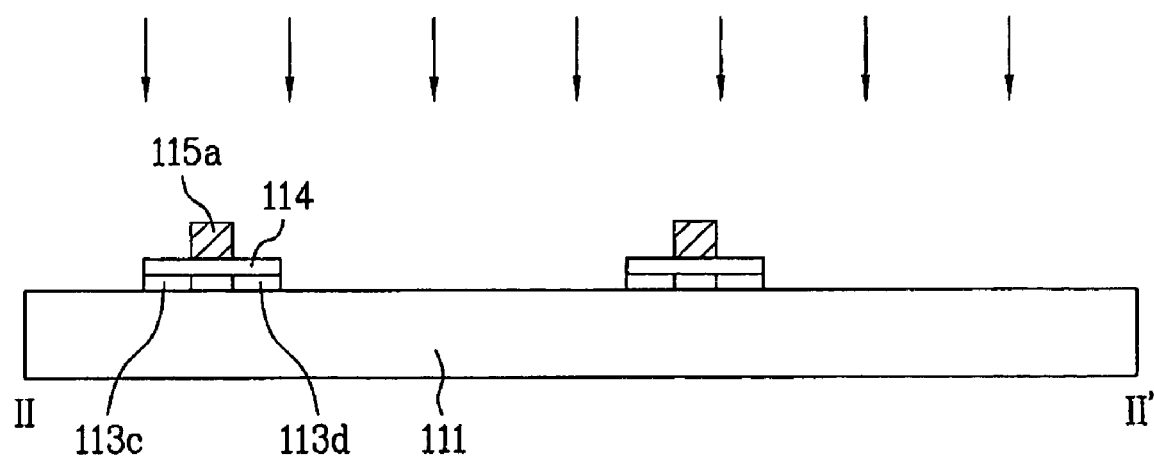

Then, as shown in FIG. 7E, the photoresist 160 is completely removed, and impurity ions are implanted into the source/drain regions 113c and 113d while using the gate electrode 115a as a mask. The semiconductor layer between the source region 113a and drain region 113b, at which the impurity ions were not doped due to the presence of the gate electrode 115a becomes a channel layer.

When forming a p-type TFT, p-type impurity ions, such as boron (B) or the like, are implanted into the source/drain regions. When forming an n-type TFT, n-type impurity ions, such as phosphorus (P), arsenic (As) or the like, are implanted into the source/drain regions 117a and 117b. That is, using plasma consisting of a dopant gas containing no semiconductor layer-forming gas, dopant gas ions are allowed to be adsorbed onto the surface of the semiconductor layer 113, thereby terminating dangling bonds of the silicon layer. This is because when large numbers of dangling bonds are present in the silicon layer 113, carriers are captured by the dangling bonds, thereby significantly decreasing the mobility of the silicon layer.

Figure 7F:
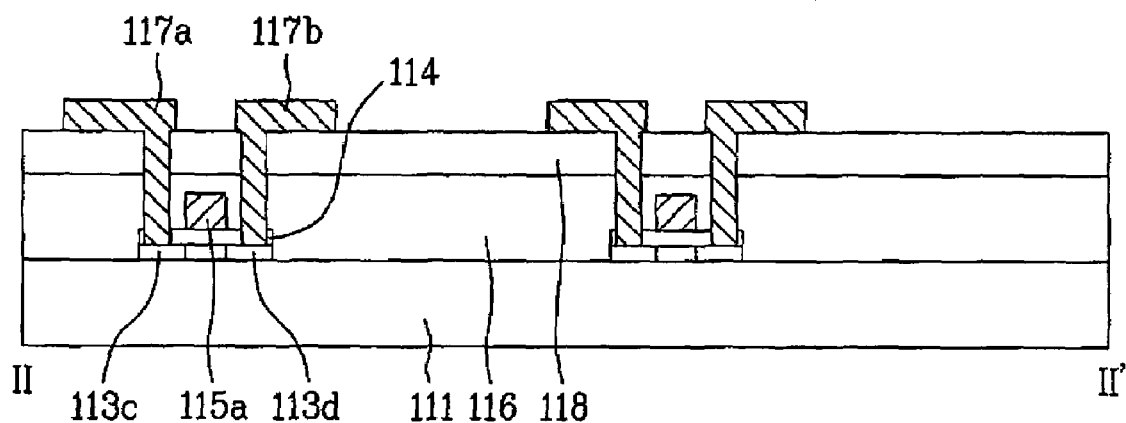

Next, as shown in FIG. 7F, an inorganic material, such as silicon dioxide ($SiO_2$) or a silicon nitride (SiNx), is deposited over the resulting structure, including the gate electrode 115a using chemical vapor deposition (CVD), thereby continuously forming an interlayer dielectric layer 116 and a passivation layer 118. Then, from the upper part of the passivation layer, the semiconductor layer 113 is subjected to rapid thermal annealing (RTA), laser beam irradiation using excimer laser, or thermal annealing using a furnace to activate the semiconductor layer 113. For example, excimer laser beams can be irradiated onto the surface of the semiconductor layer 113 to diffuse the dopant gas ions adsorbed on the semiconductor layer surface into the silicon layer. The irradiation of excimer laser leads to instantaneous melting of the semiconductor layer 113 such that impurity ions adsorbed on the semiconductor layer surface are melted into the silicon layer.

A hydrogenation process can also be carried out simultaneously with the activation process. That is, the substrate is heated to a range of heat resistance temperature thereof to diffuse hydrogen atoms contained in the silicon nitride (SiNx) of the passivation layer 118 into the poly-silicon layer 113p of the semiconductor layer 113, which results in binding of hydrogen atoms to dangling bonds of the poly-silicon layer 113p, thereby terminating the dangling bonds. The mobility of the poly-silicon layer 113p is improved by the termination of the dangling bonds which are detrimental to the carrier mobility, and the poly-silicon layer is stabilized through strong bonding between the silicon and hydrogen atoms.

After performing the activation process and the hydrogenation process, the gate insulating layer 114, the interlayer dielectric layer 116 and the passivation layer 118 are etched to expose the source/drain regions 113c and 113d to form contact holes. To etch the gate insulating layer 114, the interlayer dielectric layer 116 and the passivation layer 118, dry etching can be carried out. Thereafter, a low-resistance metal layer, such as copper (Cu), aluminum (Al), an aluminum alloy, molybdenum (Mo), chromium (Cr), titanium (Ti), tantalum (Ta) or molybdenum-tungsten (MoW), is deposited on the interlayer dielectric layer 116 and subjected to wet etching using HF, BOE, $NH_4F$ or a mixed solution thereof to form source/drain electrodes 117a and 117b in contact with source/drain regions 113c and 113d, respectively, and the data line 117 crossing the gate line 115 to define the sub-pixels is formed, as shown in FIGS. 6C and 7F. In this manner, a poly-silicon thin film transistor using poly-silicon as an active semiconductor layer is fabricated.

Figure 7G:
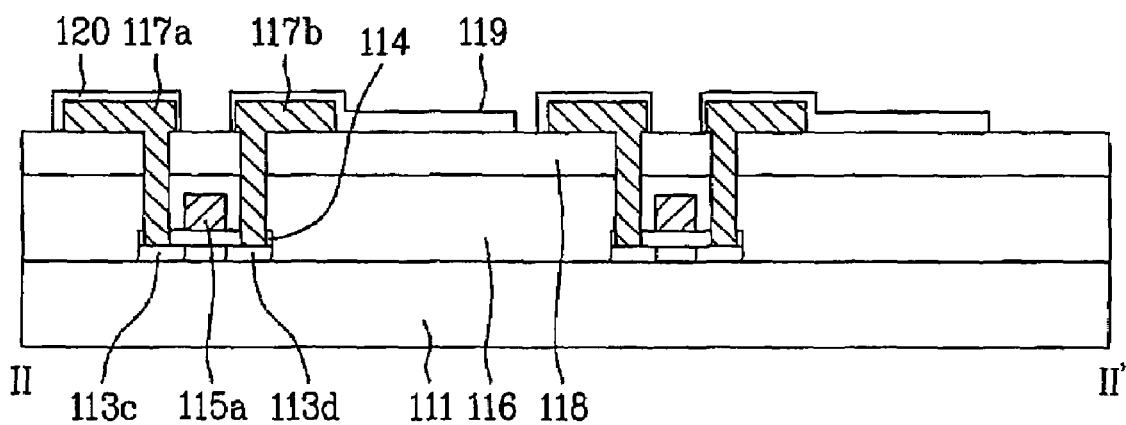

As shown in FIG. 6D and FIG. 7G, indium tin oxide (ITO) or indium zinc oxide (IZO) is deposited over the passivation layer 118, and is then subjected to patterning to form pixel electrodes 119 covering the drain electrodes 117b and oxidation-preventing layers covering the data lines 117 and the source electrodes 117a.

As described above, embodiments of the invention uses exposure masks to perform collective patterning of the semiconductor layer and the gate line layers, patterning of the data line layers, patterning of the contact holes and patterning of the pixel electrodes. Therefore, it is possible to complete the poly-silicon TFT array substrate using a total of four exposure masks at four different times.

As apparent from the above description, the poly-silicon TFT array substrate according to embodiments of the invention and the method for fabricating the same has at least the following advantages. First, the flow of signals between adjacent sub-pixels is prevented, due to a significant difference between the poly-silicon mobility of the channel layer and the amorphous silicon mobility below the gate line. Therefore, it is possible to prevent deterioration of display image due to signal distortion, and it is also possible to reduce economic loss due to discarding poly-silicon TFT array substrates having signal distortion defects.

Second, by performing the selective crystallization, a growth direction of crystal grains may be controlled depending upon the selection of desired crystallization processes. Thus, a direction of an electric field passing through the channel layer can be induced in compliance with the direction of the crystal grains so as to ensure smooth passage of a voltage from a source electrode to a drain electrode by permitting a lateral growth of the crystal grains in the channel layer during the crystallization process. Due to an improved mobility of the channel layer due to the lateral growth of the crystal grains in the channel layer, defects associated with the flow of the voltage into the adjacent sub-pixels are prevented.

Third, a diffraction exposure process for collective patterning of the semiconductor layer and gate line layer may be reliably and safely applied to prevent signal distortion phenomenon via the selective crystallization of the channel region of the semiconductor layer. Consequently, two mask processes can be reduced to one diffraction exposure process, which results in simplification of process and reduction of process time and process costs.

Fourth, by continuous deposition of an interlayer dielectric layer and a passivation layer on the entire surface between the gate electrode and source/drain electrodes, it is possible to collectively carry out a previous two-step mask process as a one-step mask process, since a separate processes for forming contact holes of the interlayer dielectric layer and passivation layer is not needed. As a result, the number of times for using masks can be reduced, which is advantageous in terms of process efficiency and process costs.

Fifth, as compared to a related art method involving performing an activation process after formation of the interlayer dielectric layer and performing a hydrogenation process after formation of the passivation layer, embodiments of the invention can collectively carry out the activation process and the hydrogenation process after continuous deposition of the interlayer dielectric layer and passivation layer over the gate electrode and source/drain electrodes, thereby further simplifying the process.

It will be apparent to those skilled in the art that various modifications and variations can be made in the poly-silicon thin film transistor (TFT) array substrate and a method for fabricating the same of embodiments of the invention without departing from the spirit or scope of the invention. Thus, it is intended that embodiments of the invention cover the modifications and variations of this invention provided they come within the scope of the appended claims and their equivalents.

What is claimed is:

1. A poly-silicon thin film transistor array substrate comprising:
   a gate line and a gate electrode over a substrate;
   a semiconductor layer having source/drain regions doped with impurity ions;
   a data line crossing the gate line, and source/drain electrodes connected to the source/drain regions; and
   a pixel electrode connected to the drain electrode,
   wherein the semiconductor layer is poly-silicon except for an amorphous silicon region below the gate line.

2. The array substrate according to claim 1, wherein the semiconductor layer except for the source/drain regions has the same pattern as the gate line and the gate electrode.

3. The array substrate according to claim 2, further comprising a gate insulating layer having the same pattern as the semiconductor layer between the semiconductor layer, and both the gate line and the gate electrode.

4. The array substrate according to claim 1, further comprising an interlayer dielectric layer between the gate electrode and the source/drain electrodes.

5. The array substrate according to claim 1, further comprising a passivation layer between the source/drain electrodes and the pixel electrode.

6. The array substrate according to claim 1, further comprising a stacked layer of an interlayer dielectric layer and a passivation layer between the gate electrode and the source/drain electrodes.

7. The array substrate according to claim 6, wherein the drain electrode is covered by the pixel electrode, and the data line and source electrode are covered by an oxidation-preventing layer on the same layer as the pixel electrode.

8. The array substrate according to claim 1, wherein the amorphous silicon region is between adjacent sub-pixel regions.

9. The array substrate according to claim 1, wherein a channel region between the source region and the drain region is crystallized into poly-silicon.

10. The array substrate according to claim 9, wherein the amorphous silicon region is between adjacent sub-pixel regions.

11. A method for fabricating a poly-silicon thin film transistor array substrate comprising:
    forming an amorphous silicon layer on a substrate;
    selectively crystallizing the amorphous silicon layer;
    forming a gate insulating layer and a metal layer on the selectively-crystallized silicon layer;
    patterning the selectively-crystallized silicon layer, the gate insulating layer and the metal layer so as to form a semiconductor layer, a gate line and a gate electrode;
    implanting impurities into source/drain regions of the semiconductor layer using the gate electrode as a mask;
    forming source/drain electrodes insulated from the gate electrode and connected to the source/drain regions, and a data line crossing the gate line; and
    forming a pixel electrode connected to the drain electrode.

12. The method according to claim 11, wherein the crystallization is performed by one of solid phase crystallization, excimer laser annealing and sequential lateral solidification.

13. The method according to claim 11, wherein the selectively crystallizing is performed on a channel region of the semiconductor below the gate electrode.

14. The method according to claim 11, wherein the selectively crystallizing is performed on the semiconductor layer except for a predetermined region below the gate line.

15. The method according to claim 14, wherein the semiconductor layer below the gate line remains to be an amorphous silicon layer.

16. The method according to claim 11, further comprising forming an insulating layer between the gate electrode and the source/drain electrodes, wherein the insulating layer is a stacking layer of an interlayer dielectric layer and a passivation layer.

17. The method according to claim 16, further comprising performing an activation process and a hydrogenation process continuously after forming the insulating layer.

18. The method according to claim 16, further comprising performing an activation process after forming the interlayer dielectric layer.

19. The method according to claim 16, further comprising performing a hydrogenation process after forming the passivation layer.

20. The method according to claim 16, wherein the pixel electrode is formed to cover the drain electrode, and an oxidation-preventing layer which is further formed simultaneously with the pixel electrode is formed to cover the data line and the source electrode.

21. The method according to claim 11, further comprising forming an interlayer dielectric layer between the gate electrode and the source/drain electrodes and forming a passivation layer between the source/drain electrodes and the pixel electrode.

22. The method according to claim 21, wherein the pixel electrode is connected to the drain electrode through a contact hole formed in the passivation layer.

23. The method according to claim 21, further comprising:
performing an activation process after forming the interlayer dielectric layer; and
performing a hydrogenation process after forming the passivation layer.

24. A method for fabricating a poly-silicon thin film transistor array substrate, comprising:
forming a semiconductor layer having an amorphous silicon portion and a poly-silicon portion on a substrate;
forming a gate line and a gate electrode insulated from the semiconductor layer, wherein the amorphous silicon portion is overlapped by the gate line;
implanting impurities into source/drain regions of the semiconductor layer using the gate electrode as a mask;
forming source/drain electrodes connected to the source/drain regions and a data line crossing the gate line; and
forming a pixel electrode connected to the drain electrode.

25. The method according to claim 24, wherein the semiconductor layer has the same pattern as the gate line.

26. The method according to claim 25, wherein the semiconductor layer, the gate line and gate electrode are concurrently formed by photolithography.

27. The method according to claim 24, wherein the poly-silicon portion includes a channel region.

28. The method according to claim 24, wherein the amorphous silicon portion is located between adjacent pixels.

* * * * *